(12) United States Patent
Saigan (10) Patent No.: US 11,809,244 B2
(45) Date of Patent: Nov. 7, 2023

(54) INFORMATION PROCESSING APPARATUS (71) Applicant: HITACHI, LTD., Tokyo (JP)

(72) Inventor: Yuichi Saigan, Tokyo (JP)

(73) Assignee: HITACHI, LTD., Tokyo (JP)

(*) Notice: Subject to any disclaimer, the term of this patent is extended or adjusted under 35 U.S.C. 154(b) by 0 days.

(21) Appl. No.: 17/697,995

(22) Filed: Mar. 18, 2022

(65) Prior Publication Data
US 2023/0122961 A1 Apr. 20, 2023

(30) Foreign Application Priority Data
Oct. 20, 2021 (JP) .................................. 2021-171605

(51) Int. Cl.
*G06F 1/20* (2006.01)
*H05K 7/14* (2006.01)
*H05K 7/20* (2006.01)

(52) U.S. Cl.
CPC ............. *G06F 1/20* (2013.01); *H05K 7/1457* (2013.01); *H05K 7/20172* (2013.01)

(58) Field of Classification Search
CPC .......... G06F 1/187; G06F 1/188; G06F 1/185; G06F 3/0658; G06F 13/00; G06F 1/184; H05K 7/1445; H05K 7/1487; H05K 7/1492; H05K 7/1439; H05K 7/1457; H05K 2201/044
See application file for complete search history.

(56) References Cited

U.S. PATENT DOCUMENTS

| | | | | |
|---|---|---|---|---|
| 6,038,126 A * | 3/2000 | Weng | ..................... | G06F 1/189 361/679.01 |
| 7,139,170 B2 * | 11/2006 | Chikusa | ............... | G11B 33/126 |
| 7,722,359 B1 * | 5/2010 | Frangioso, Jr. | ...... | H05K 7/1445 361/679.48 |
| 8,345,439 B1 * | 1/2013 | Goergen | ............. | H05K 7/1458 361/792 |
| 8,868,957 B2 * | 10/2014 | Davis | ........................ | G06F 1/30 713/340 |
| 9,116,660 B1 * | 8/2015 | Widmann | ................. | G06F 1/20 |
| 9,231,357 B1 * | 1/2016 | Felton | ................... | G11B 33/128 |
| 10,568,238 B1 * | 2/2020 | Leung | ................ | H05K 7/20736 |
| 11,281,398 B1 * | 3/2022 | Zheng | ................. | G06F 13/4221 |

(Continued)

FOREIGN PATENT DOCUMENTS

JP 2010-232237 A 10/2010

*Primary Examiner* — Michael A Matey
(74) *Attorney, Agent, or Firm* — MATTINGLY & MALUR, PC (57) ABSTRACT

A controller and a rectangular parallelepiped power supply apparatus are coupled to a rear surface of a midplane, to which a plurality of storage media drives are coupled in a front surface of the midplane. A plurality of interface connectors arranged in a left-right direction are provided at a front end of a controller substrate. The rear surface of the midplane includes a plurality of connectors for controller, which are a plurality of connectors arranged in the left-right direction to which interface connectors of the controller are respectively coupled, and a connector for power supply, which are connectors to which a power supply apparatus set horizontally is coupled. A part of a row of the connectors for controller is present below the power supply apparatus coupled sideways to the connector for power supply.

6 Claims, 10 Drawing Sheets

(56) References Cited

U.S. PATENT DOCUMENTS

| | | | |
|---|---|---|---|
| 11,314,666 B2* | 4/2022 | Aharony | G06F 13/4291 |
| 11,596,073 B2* | 2/2023 | Zhang | G06F 1/187 |
| 2006/0190484 A1* | 8/2006 | Cromer | G06F 11/004 |
| 2011/0185099 A1* | 7/2011 | Stuhlsatz | G06F 1/26 |
| | | | 710/305 |
| 2012/0081856 A1* | 4/2012 | Hopkins | G06F 1/187 |
| | | | 361/679.33 |
| 2012/0327582 A1* | 12/2012 | Goodwin | G06F 1/16 |
| | | | 361/679.31 |
| 2013/0107436 A1* | 5/2013 | Li | H05K 7/1492 |
| | | | 361/679.4 |
| 2014/0008370 A1* | 1/2014 | Judd | H05K 7/14 |
| | | | 220/500 |
| 2014/0204525 A1* | 7/2014 | Pecone | H05K 7/02 |
| | | | 361/679.33 |
| 2015/0181768 A1* | 6/2015 | Chen | H05K 7/20 |
| | | | 361/679.46 |
| 2016/0077841 A1* | 3/2016 | Lambert | G06F 9/4411 |
| | | | 713/2 |
| 2017/0083057 A1* | 3/2017 | Bettiga | G06F 1/185 |
| 2017/0262029 A1* | 9/2017 | Nelson | H05K 7/1487 |
| 2021/0144876 A1* | 5/2021 | Suzuki | H05K 7/1439 |
| 2021/0349503 A1* | 11/2021 | Patel | H05K 1/0272 |

* cited by examiner

FIG. 1

Comparative Example

FIG. 2

Comparative Example

INFORMATION PROCESSING APPARATUS

CROSS-REFERENCE TO PRIOR APPLICATION

This application relates to and claims the benefit of priority from Japanese Patent Application number 2021-171605, filed on Oct. 20, 2021 the entire disclosure of which is incorporated herein by reference.

BACKGROUND

The present invention generally relates to the structure of an information processing apparatus.

There has been known an information processing apparatus including a midplane (a substrate for relay) that partitions an internal space in the front-rear direction and a plurality of electronic devices coupled to both surfaces of the midplane. In such an information processing apparatus, a plurality of connectors are provided on both the surfaces of the midplane and a plurality of apparatuses are coupled to the plurality of connectors.

In order to realize improvement of performance or an increase in capacity of the information processing apparatus while reducing a size of the information processing apparatus to a predetermined size (for example, 1U or 2U), it is necessary to avoid a size of the midplane increasing.

According to a technique disclosed in Patent Literature 1, in order to avoid the size of the midplane increasing, a substrate for power supply connection is coupled to the midplane and a power supply apparatus is coupled to the substrate.

Patent Literature 1: Japanese Patent Laid-Open No. 2010-232237

SUMMARY

In the following explanation, for convenience, one surface of a midplane is referred to as "front surface" (may be called "front face" or "front side") and the other surface of the midplane is referred to as "rear surface" (may be called "back face" or "back side"). A line of elements along the left-right direction can be referred to as "row" and a line of elements along the up-down direction can be referred to as "column".

There is an information processing apparatus including a plurality of storage media drives. For an increase in capacity of the information processing apparatus of this type, it is conceivable to dispose the storage media drives on the front surface of the midplane at high density (that is, the front surface of the midplane is substantially set as a region for the storage media drives) and dispose apparatuses other than the storage media drives on the rear surface of the midplane. The apparatuses other than the storage media drives are roughly classified into a controller and a power supply apparatus. The controller typically has a blade shape. The power supply apparatus typically has a rectangular parallelepiped shape long in the front-rear direction.

In such an information processing apparatus, the midplane includes a connector for drive on the front surface and includes a connector for controller and a connector for power supply on the rear surface.

The connector for drive is a connector to which the storage media drives are coupled.

The controller includes an interface connector. The interface connector is coupled to the connector for controller. The power supply apparatus is placed on the controller and coupled to the connector for power supply on the rear surface of the midplane.

Usually, for easiness of connector mounting, a connector on the front surface and the connector on the rear surface of the midplane are provided in positions not overlapping each other in a front view (a plan view) of the midplane.

If the storage media drives are arranged at high density, input and output targets of the controller increase. Therefore, a larger number of interface connectors are necessary in the controller for communication with a larger number of storage media drives. Since the interface connectors are arranged along the left-right direction of the controller, it is conceivable to increase the interface connectors in the left-right direction. Therefore, it is conceivable to increase connectors for controller as well along the left-right direction on the rear surface of the midplane.

However, when the interface connectors and the connectors for controller are respectively sufficiently increased in the left-right direction, the positions of the interface connectors and the connectors for controller interfere with the position of the power supply apparatus.

As a method of avoiding such a problem, any one of methods described below is conceivable.

(A) Set the positions of the connectors for controller right behind the positions of the connectors for drive (superimpose the positions of the connectors for controller on the positions of the connectors for drive in a front view of the midplane).

(B) Divide one controller into a plurality of sub-controllers and array the sub-controllers in the up-down direction.

(C) Couple an extended substrate on which a plurality of connectors for controller are provided to the midplane based on the technique disclosed in Patent Literature 1.

However, mounting is not easy in all of the methods (A) to (C). Specifically, in the method (A), mounting of the connectors is not easy. In the method (B), a complicated mechanism for position accuracy maintenance of simultaneous fitting is necessary. In the method (C), the controllers need to communicate with the storage media drive via the extended substrate.

An information processing apparatus includes a midplane, which is a circuit board, a plurality of storage media drives coupled to a front surface of the midplane, a controller coupled to a rear surface of the midplane, and a rectangular parallelepiped power supply apparatus. The controller includes a controller board, which is a circuit board, and a plurality of controller components provided on the controller board. The plurality of controller components include a plurality of interface connectors arranged in a left-right direction along a front end of the controller substrate. The front surface of the midplane includes a plurality of connectors for drive, the connectors for drive being connectors to which the storage media drives are respectively coupled. The rear surface of the midplane includes a plurality of connectors for controller, which are a plurality of connectors arranged in the left-right direction to which the interface connectors of the controller are respectively coupled, and a connector for power supply, which is a connector to which the power supply apparatus set sideways is coupled. A part of a row of the connectors for controller is present below the power supply apparatus coupled sideways to the connector for power supply.

According to the present invention, it is possible to provide a larger number of connectors for controller along the left-right direction on the rear surface of the midplane without increasing the information processing apparatus in size.

DESCRIPTION OF EMBODIMENTS

In the following explanation, when elements of the same kinds are explained without being distinguished, common reference numerals and signs among reference numerals and signs are sometimes used and, when the elements of the same kinds are distinguished and explained, the reference numerals and signs are sometimes used.

In the following explanation, for convenience, as words representing positions and directions based on any position, words such as "front", "rear", "left", "right", "up", and "down" are used. The positions and the directions can also be explained using an orthogonal coordinate system (an x axis, a y axis, and a z axis) of a three-dimensional space. A left-right direction can be an example of an x-axis direction, a front-rear direction can be an example of a y-axis direction, and an up-down direction can be an example of a z-axis direction.

About various elements (for example, a controller, a fan, and a processor) explained below, the numbers of the element may not be limited to the illustrated numbers.

An embodiment of the present invention is explained below. The embodiment explained below is illustration for explanation of the present invention and is not intended to limit the scope of the present invention to only this embodiment. The present invention can also be executed in other various forms.

First, an information processing apparatus according to a comparative example is explained with reference to FIGS. 1 and 2.

Figure 1:
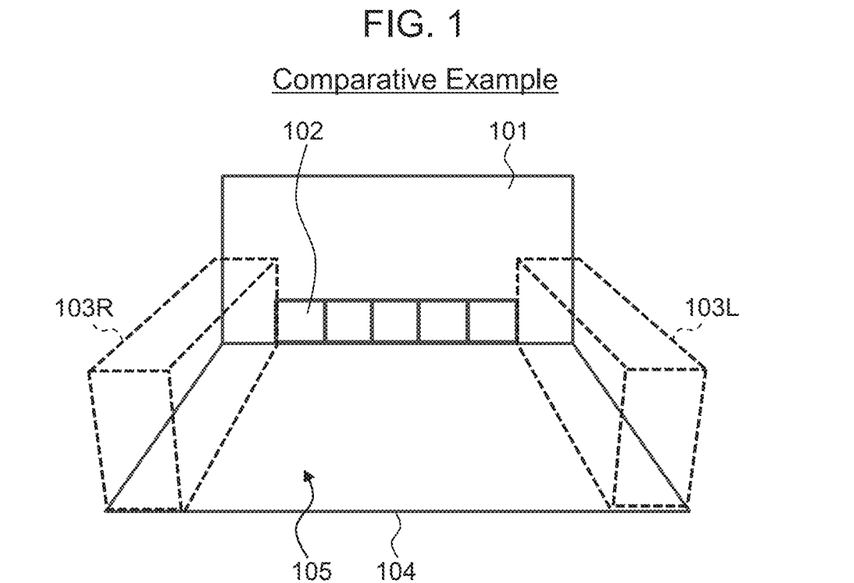
FIG. 1 is a schematic diagram of a part of the inside of an information processing apparatus according to a comparative example.
Figure 2:
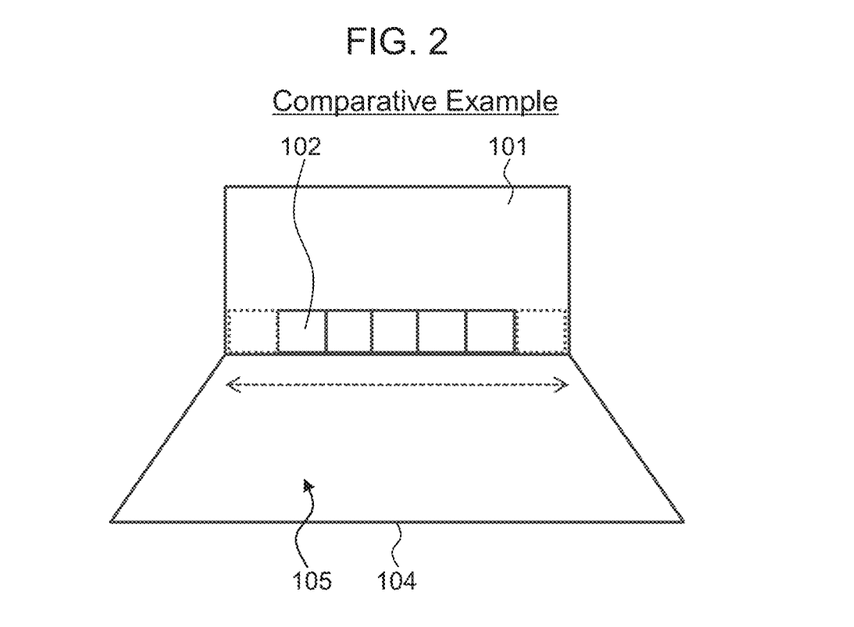
FIG. 2 is a schematic diagram of a problem of the information processing apparatus according to the comparative example.

As shown in FIG. 1, a plurality of connectors for controller 102 arranged along the left-right direction are provided on the rear surface lower end (the lower edge) of a midplane 101.

A controller 105 is coupled to a rear surface of the midplane 101. Specifically, a substrate 104 of the controller 105 is coupled to the connectors for controller 102.

Rectangular parallelepiped power supply apparatuses 103R and 103L set lengthways are coupled to the rear surface of the midplane 101. Specifically, a region long in the front-rear direction including both the left and right ends on the controller substrate 104 is a region where the power supply apparatuses 103R and 103L set lengthways longest in the front-rear direction (larger in height than width) are placed.

If storage media drives (an example of input and output apparatuses to and from which data is input and output by the controller 105) are coupled to a front surface of the midplane 101 at high density, input and output targets of the controller 105 increase. Therefore, a larger number of interface connectors (not shown) are necessary in the controller 105 for communication with a larger number of storage media drives. Since the interface connectors are arranged along the left-right direction of the controller 105, it is conceivable to increase the interface connectors in the left-right direction. Therefore, as shown in FIG. 2, it is conceivable to increase the connectors for controller 102 as well along the left-right direction on the rear surface of the midplane 101.

However, if the connectors for controller 102 are sufficiently increased in the left-right direction, the positions of the connectors for controller 102 interfere with the positions of the power supply apparatuses 103. Specifically, for example, as represented by broken line frames in FIG. 2, the connectors for controller 102 cannot be provided in positions interfering with the positions of the power supply apparatuses 103.

Therefore, in this embodiment, a configuration explained below is adopted in an information processing apparatus. Note that, in the embodiment explained below, an SSD (Solid State Drive) 303 is adopted as a storage media drive.

Figure 3:
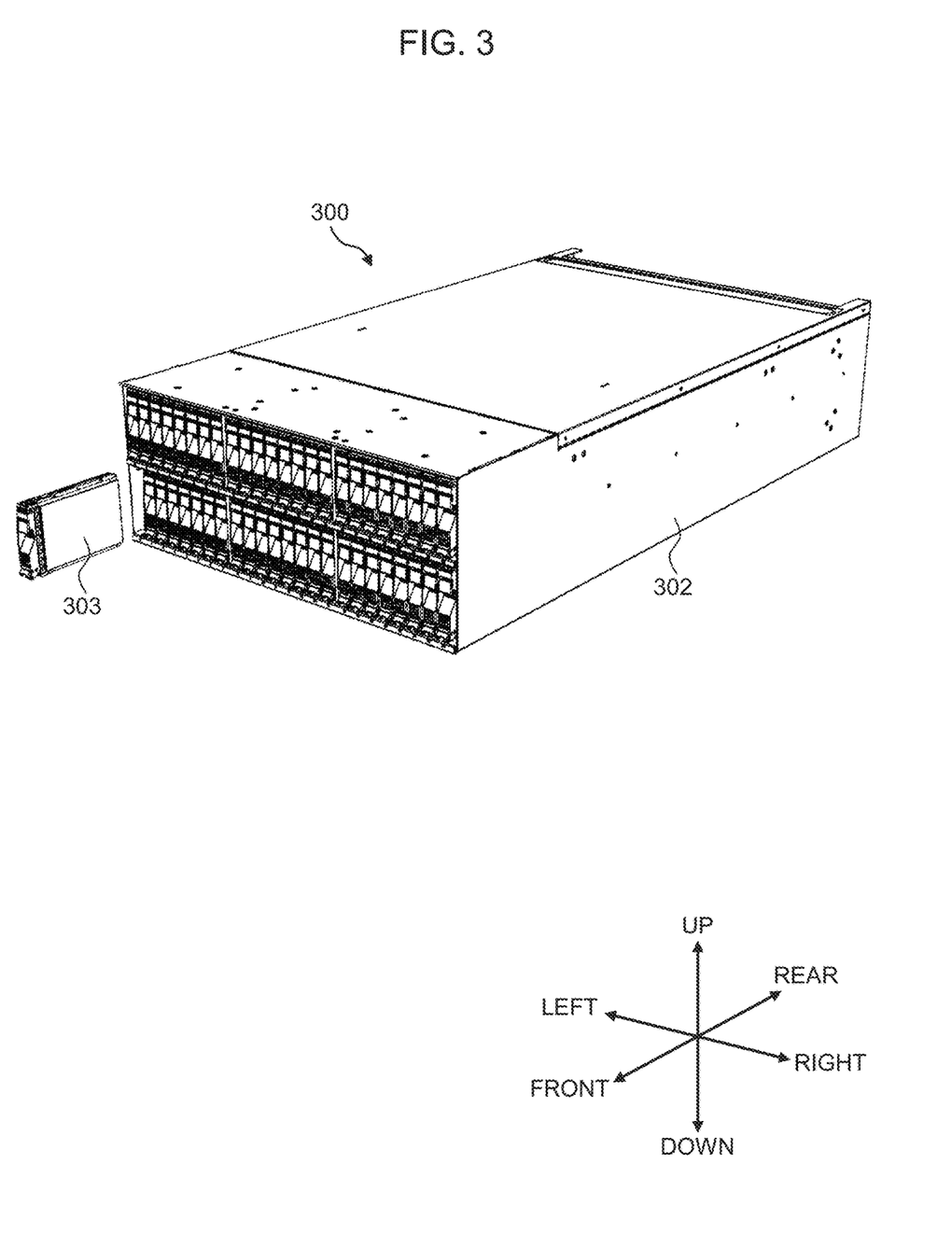
FIG. 3 is a front perspective view of an information processing apparatus according to an embodiment.
Figure 4:
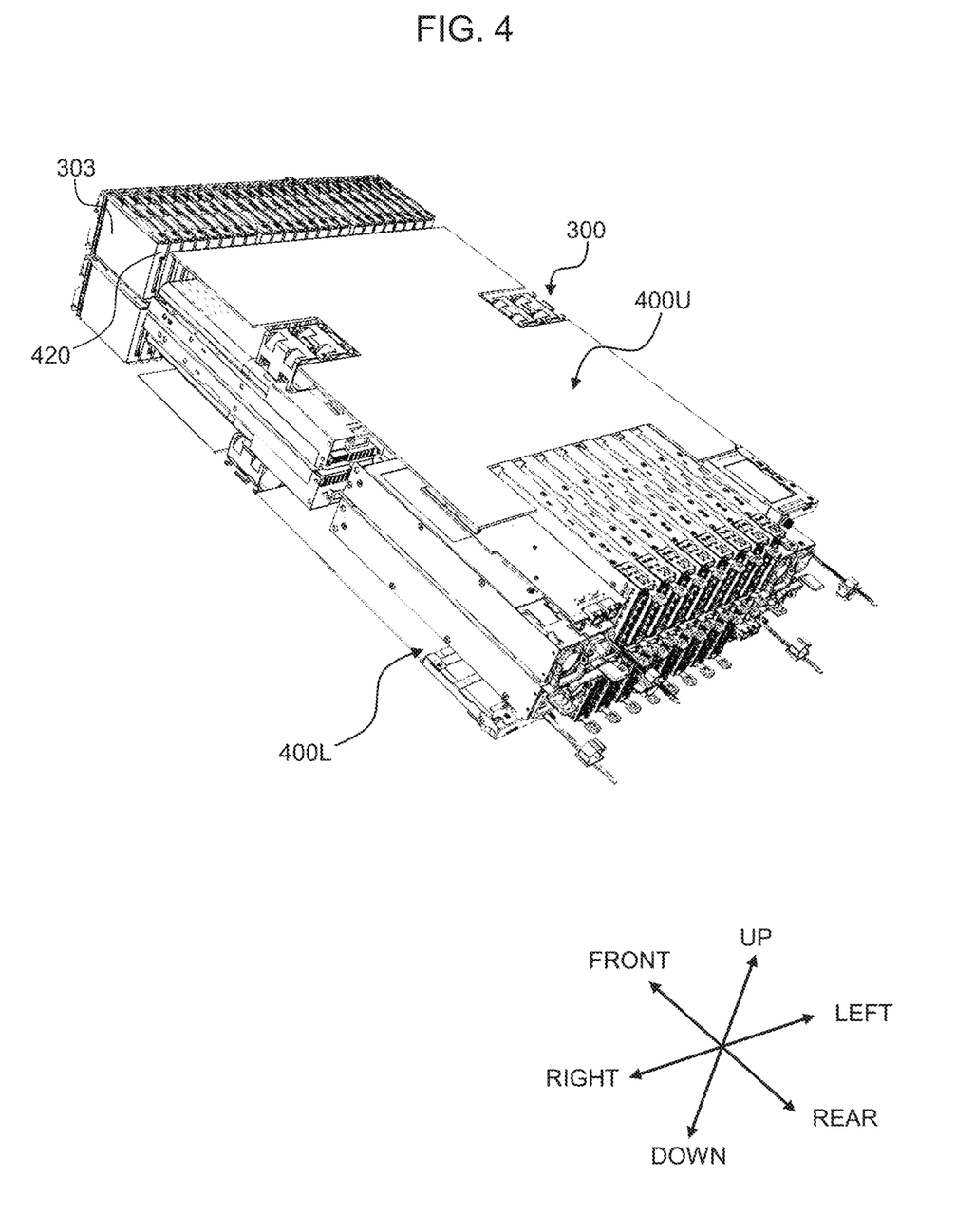
FIG. 4 is a rear perspective view of the information processing apparatus from which a rack (and a convex cover) is removed.

FIG. 3 is a front perspective view of an information processing apparatus according to the embodiment. FIG. 4 is a rear perspective view of the information processing apparatus from which a rack (and a convex cover explained below) are removed.

An information processing apparatus 300 includes a rectangular parallelepiped rack 302 in which components of the apparatus 300 are housed. The rack 302 may have a predetermined size conforming to a predetermined standard. For example, the rack 302 may be a 19-inch rack (4U) standardized in an EIA (Electronic Industries Alliance). The rack 302 has an upper surface, a lower surface (a bottom surface), a right side surface, and a left side surface. A front surface and a rear surface of the rack 302 are opened.

The SSD 303 is inserted from the opened front surface of the rack 302 and coupled to a front surface of a midplane 420 on the inside.

Although not shown in the figure, the same apparatus sets 400 in upper and lower two stages (an apparatus set 400U on the upper side is a vertically reversed apparatus set) are inserted from the opened rear surface of the rack 302 and coupled to a rear surface of the midplane 420. Each of the apparatus sets 400 is a rectangular parallelepiped apparatus set having approximately the half height of the rack 302. For example, the rack 302 may be 4U and each apparatus set may be 2U. A gap may be substantially absent or, even if a gap is present, the gap may be small between an upper-side apparatus set 400U (a vertically reversed apparatus set) and a lower-side apparatus set 400L).

Figure 5:
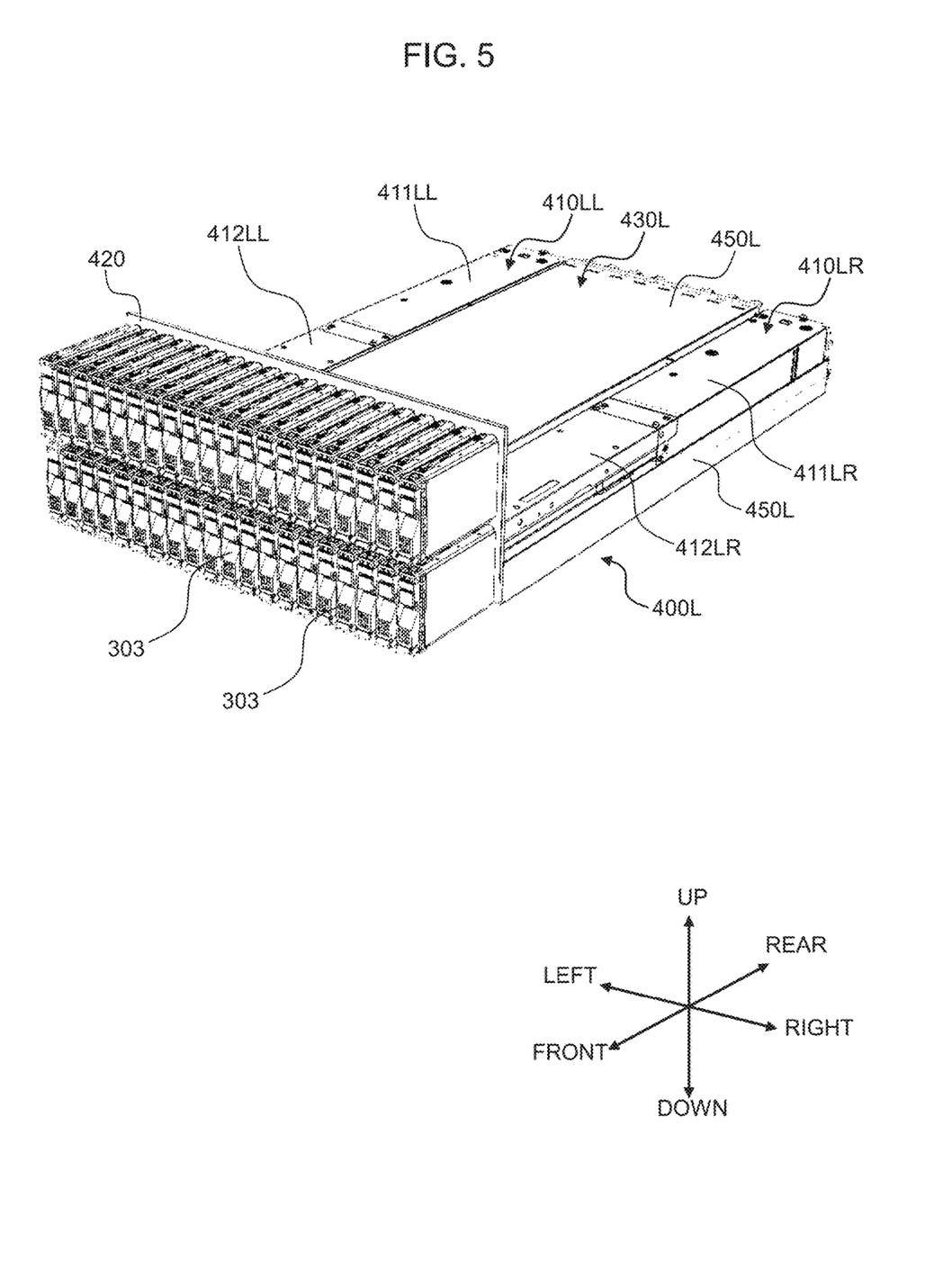
FIG. 5 is a front perspective view of a plurality of SSDs and a lower-side apparatus set coupled to a midplane.
Figure 6:
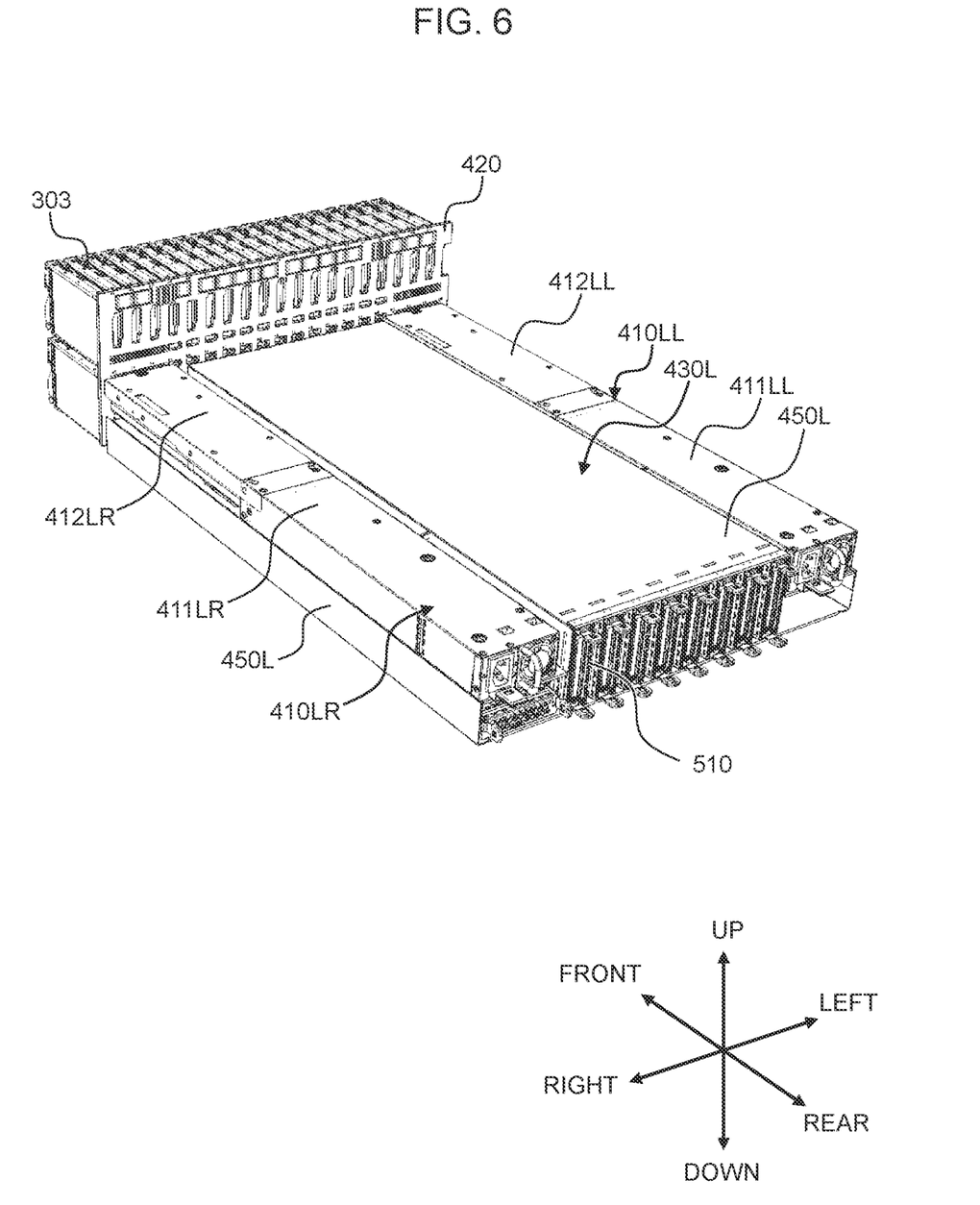
FIG. 6 is a rear perspective view of the plurality of SSDs and the lower-side apparatus set coupled to the midplane.

FIGS. 5 and 6 are respectively perspective views of a plurality of SSDs 303 and the lower-side apparatus set 400L coupled to the midplane 420. Both of FIGS. 5 and 6 are equivalent to a perspective view of the information processing apparatus 300 from which the rack 302 and the upper-side apparatus set 400U are removed.

The plurality of SSDs 303 are coupled to the front surface of the midplane 420. In other words, SSD rows in upper and lower two stages are present on the front surface of the midplane 420. Each SSD row is configured by two or more SSDs arranged in the left-right direction. In the SSD row, each SSD 303 is longitudinally oriented (that is, each SSD 303 is the longest in the front-rear direction and larger in height than width). The SSDs 303 are disposed at high density on the front surface of the midplane 420.

The lower-side apparatus set 400L is coupled to the rear surface of the midplane 420. The lower-side apparatus set 400L includes a controller 430L, a convex cover 450L, and power supply apparatuses 410LR and 410LL.

The power supply apparatuses 410LR and 410LL are, for example, redundant power supply apparatuses. One of the power supply apparatuses 410LR and 410LL may be absent. A power supply apparatus 410LL (410LR) is the longest in the front-rear direction and coupled sideways to the rear surface of the midplane 420 (such that a surface having the largest area is horizontal). The power supply apparatus 410LL (410LR) is configured by a power supply unit 411LL (411LR) and a battery unit 412LL (412LR) that is set in series with the power supply unit 411LL (411LR) (arranged along the front-rear direction) and closer to the midplane 420 than the power supply unit 411LL (411LR).

Figure 7:
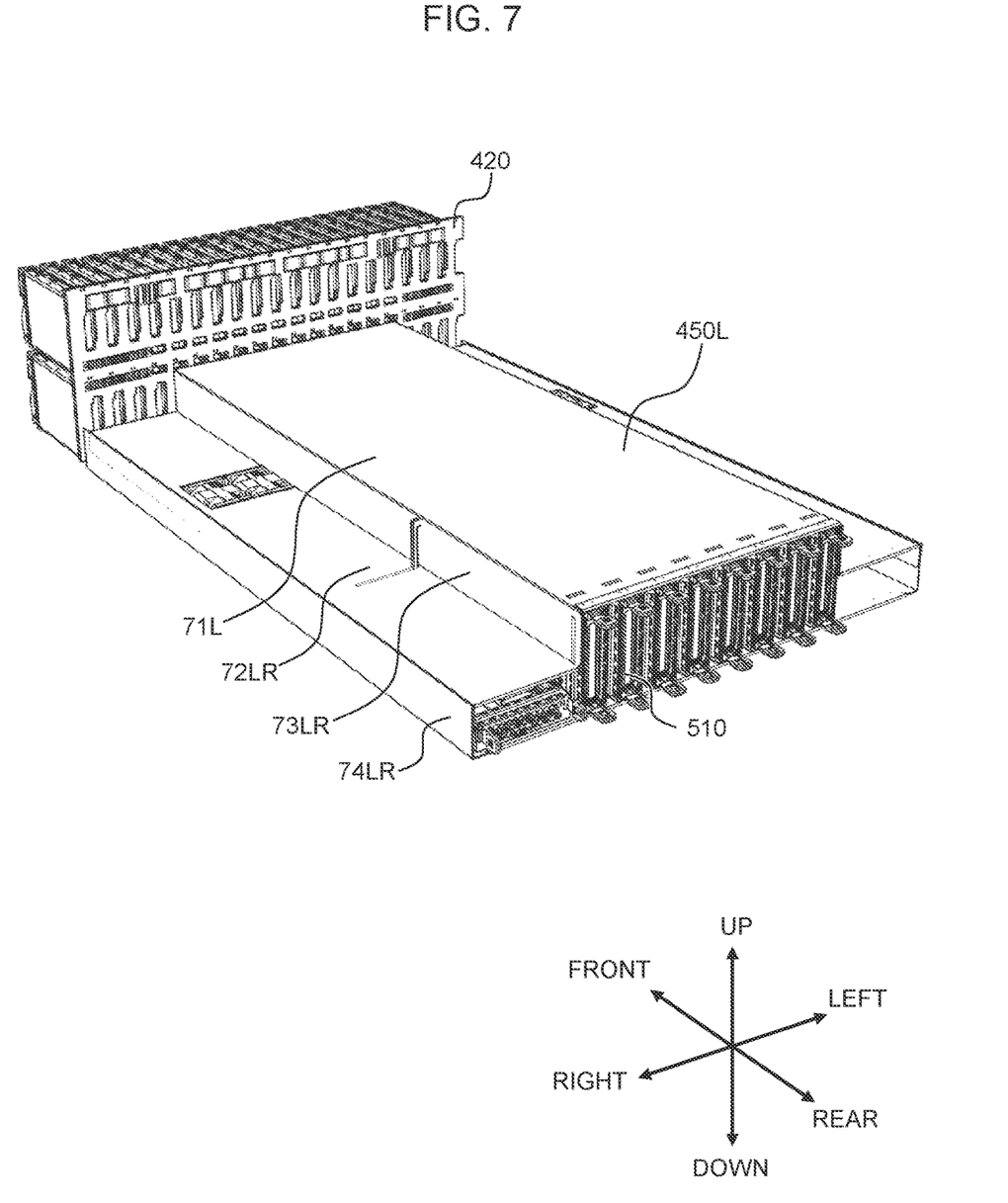
FIG. 7 is a rear perspective view of the lower-side apparatus set from which a power supply apparatus is removed.

The controller 430L is covered by the convex cover 450L. Specifically, for example, as shown in FIG. 7, the convex cover 450L is the longest in the front-rear direction. In a top view of the controller 430L, substantially the entire region of the controller 430L is covered by the convex cover 450L.

The convex cover 450L has a shape, a cut surface of which along the left-right and up-down directions is convex. Specifically, the convex cover 450L includes a first upper surface 71L present at first height and a second upper surface 72L present at second height lower than the first height. Referring to a right half (a left half when viewed from the rear) of the convex cover 450L as an example, the convex cover 450L includes a first side surface 73LR extending perpendicularly downward from the right edge (an example of one side edge) of the first upper surface 71L to the left edge (an example of the other side edge) of a second upper surface 72LR and a second side surface 74LR perpendicularly extending downward from the right edge (an example of one side edge) of the second upper surface 72LR (for example, extending to a substrate of the controller 430L). All of the surfaces 71L to 74L may not be a continuous surface. For example, a part of the surfaces 71L to 74L may form an opening. The power supply apparatus 410L set in sideways may be coupled to the rear surface of the midplane 420 and placed on the second upper surface 72L. In that state, the upper surface of the power supply apparatus 410L set sideways and the first upper surface 71L of the convex cover 450L may be substantially flush with each other. The convex cover 450L may be a sheet metal bent to have a convex shape in a front view.

Figure 8:
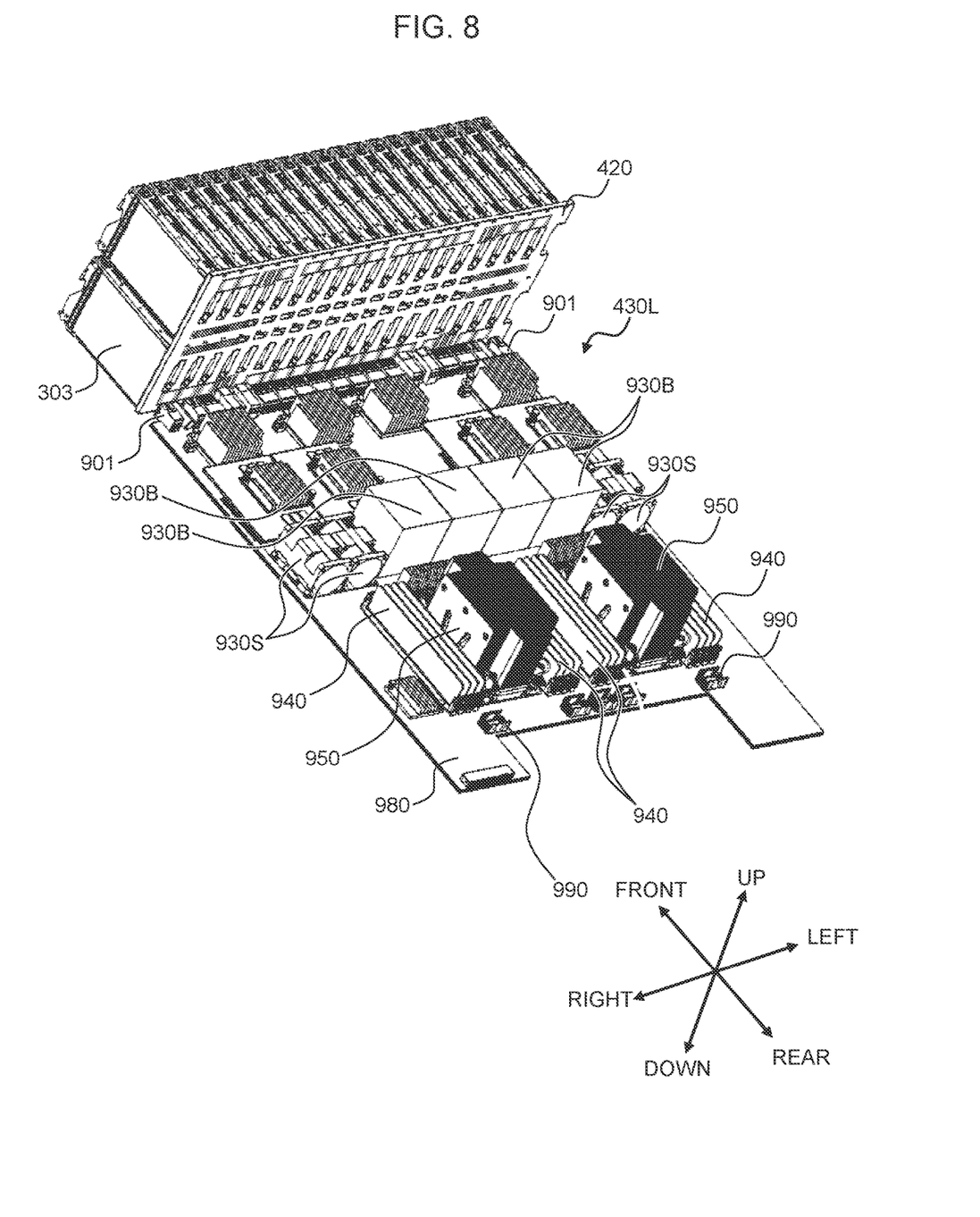
FIG. 8 is a perspective view of a controller.

As shown in FIG. 8, the controller 430L includes a controller board (a circuit board) 980 and a plurality of controller components provided on the controller board 980. The plurality of controller components include a plurality of interface connectors 901 arranged in the left-right direction along the front end (the front edge) of the controller board 980. The plurality of controller components include two or more controller components having different heights. The two or more controller components include, for example, from the rear to the front, a plurality of input and output connectors 990, processors 950, DIMMs (Dual Inline Memory Modules) 940, and a plurality of fans 930.

The plurality of input and output connectors 990 are arranged in the left-right direction, for example, at substantially the tail end of the controller board 980. A plurality of input and output modules (communication interface modules such as a NIC (Network Interface Card)) 510 are coupled to the plurality of input and output connectors 990 (see, for example, FIGS. 6 and 7).

The DIMMs (Dual Inline Memory Modules) 940 are disposed on both the left and right sides of the processors 950. Sets of the processors 950 and the DIMMs 940 are arranged in the left-right direction. The DIMMs 940 are an example of a memory module. Since the DIMMs 940 are used by the processors 950, the DIMMs 940 are provided in positions close from the processors 950 (for example, on one or both of the left and the right of the processors 950).

The plurality of fans 930 are fans (typically axial fans) that are arrayed in the left-right direction and respectively suck air in the front and exhaust the air to the rear. The plurality of fans 930 arrayed in the left-right direction include, on the center side of the controller board 980, a plurality of first fans 930B (for example, large fans) arranged in the left-right direction and include, on both the left and right sides of the controller board 980, a plurality of (or one) second fans 930S (for example, small fans) arranged in the left-right direction. The second fans 930S are lower than the first fans 930B. The first fans 930B are, for example, elements that have low power consumption but have low space efficiency (elements that make it difficult to increase the density of the controller 430L). The second fans 930S are, for example, elements that have high power consumption but have high space efficiency.

Figure 9:
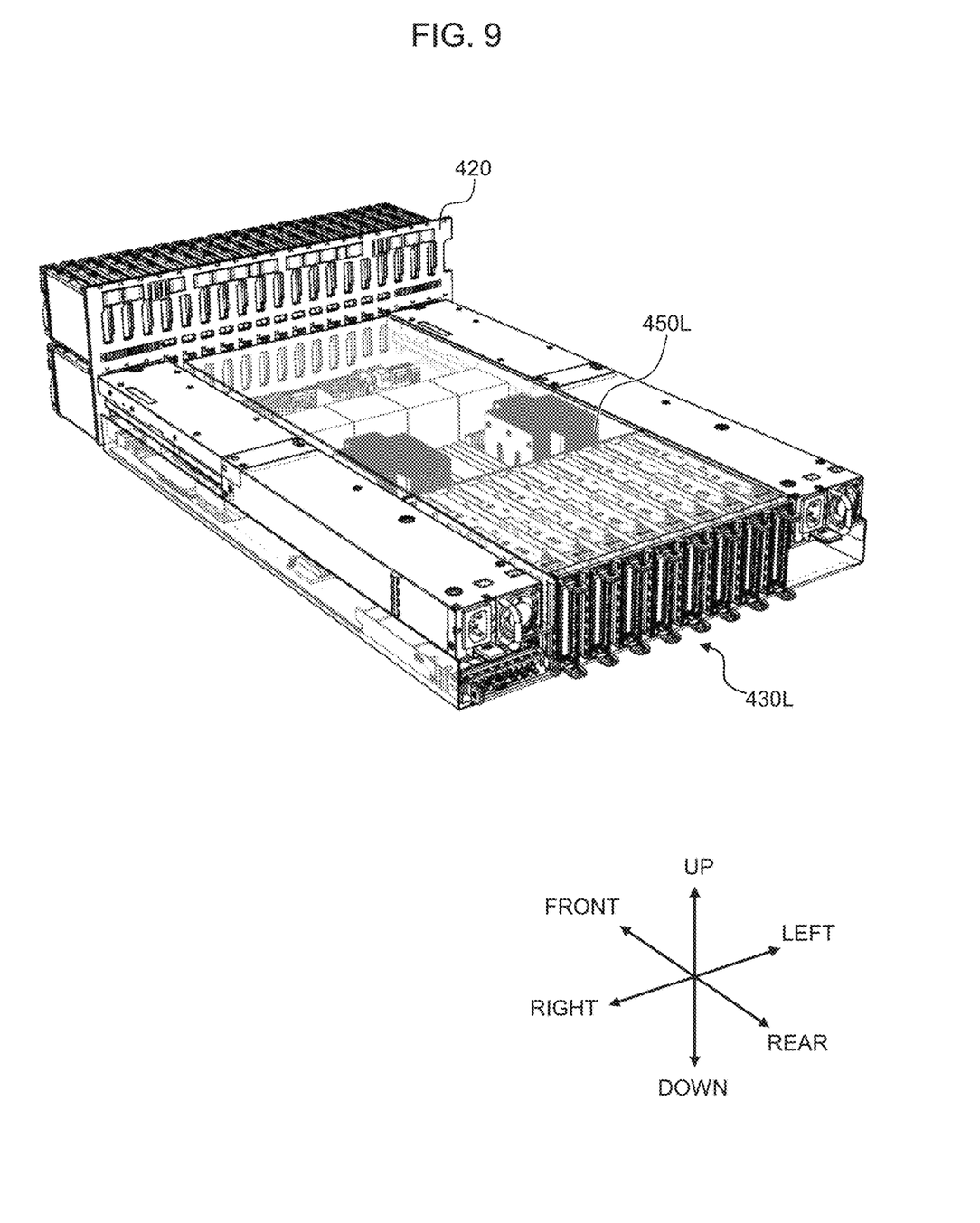
FIG. 9 is a rear perspective view of the lower-side apparatus set in which the convex cover is made semitransparent.

FIG. 9 is a rear perspective view of the lower-side apparatus set 400L in which the convex cover 450L is made semitransparent. As shown in FIGS. 7 to 9, relatively high controller components among the plurality of controller components, for example, the first fans 930B and the processors 950 are present under a first upper surface 71L of the convex cover 450L. On the other hand, relatively low controller components among the plurality of controller components, for example, the DIMMs 940 and the second fans 930S are present under a second upper surface 72L of the convex cover 450L.

Figure 10:
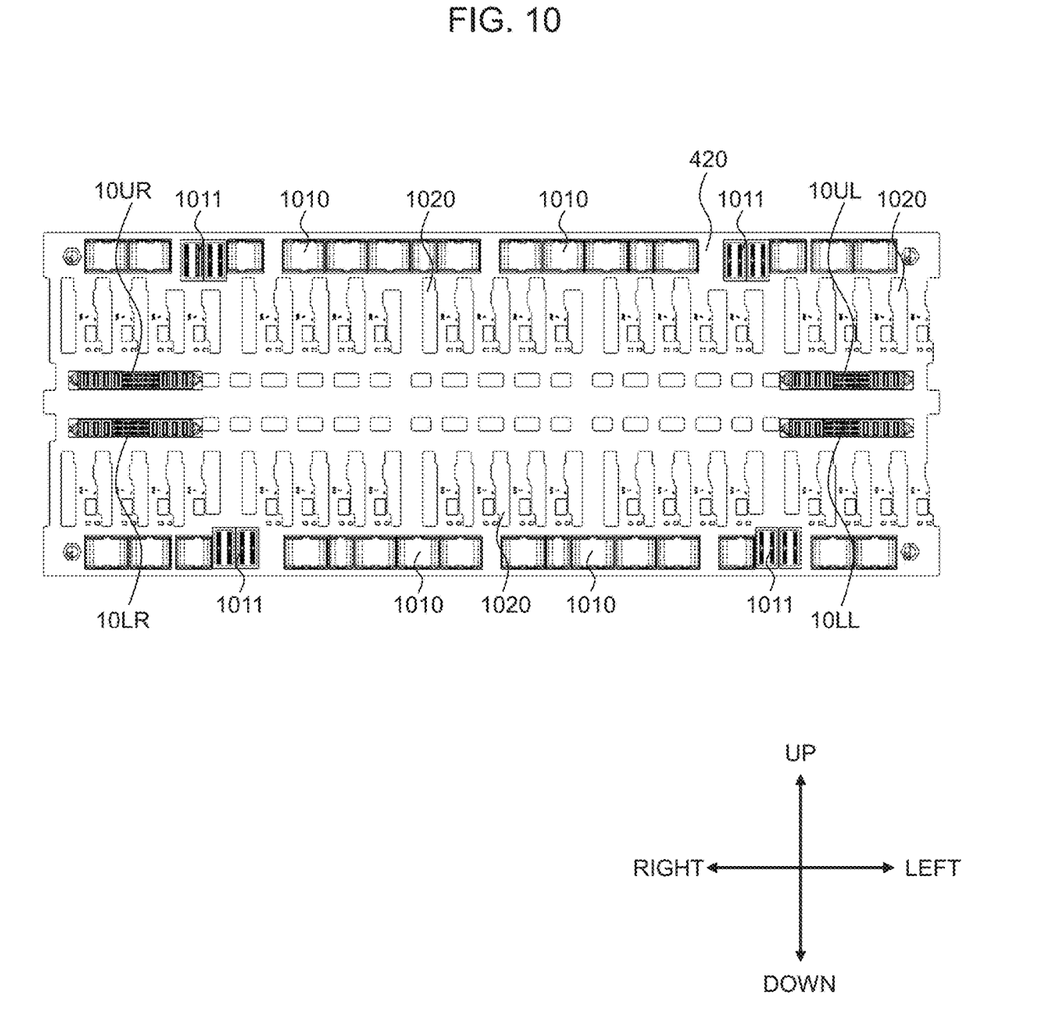
FIG. 10 is a diagram showing a rear view of the midplane.

FIG. 10 is a diagram showing a rear view of the midplane 420.

On the rear surface of the midplane 420, a row of connectors for controller (a plurality of connectors for controller arranged in the left-right direction) is provided at each of an upper end and a lower end. As explained above, since spaces are formed between the power supply apparatuses 410 and the controller board, the row of the connectors for controller can be extended to both the left and right ends of the rear surface of the midplane 420. Even if such a configuration is adopted, the position of the row of the connectors for controller does not interfere with the positions of the power supply apparatuses 410. The interface connector 901 provided on the controller board 980 is coupled to each connector for controller. Note that, as the connectors for controller, there are connectors for controller signal 1010 through which signals input to and output from controllers 430 pass and connectors for controller power feed 1011 through which electric power supplied to the controllers 430 passes.

On the rear surface of the midplane 420, connectors for power supply 10 are provided in the center and both the left and right ends. Specifically, as the connectors for power supply 10, there are connectors for power supply 10UL and 10UR to which left and right power supply apparatuses of the upper-side apparatus set 400U are coupled and connectors for power supply 10LL and 10LR to which the left and right power supply apparatuses 410LL and 410LR of the lower-side apparatus set 400L are coupled. The power supply apparatuses 410 are coupled sideways to the connectors for power supply 10.

The midplane 420 forms a row of slits 1020 (a plurality of slits 1020 arranged in the left-right direction). The slits 1020 are explained below.

Figure 11:
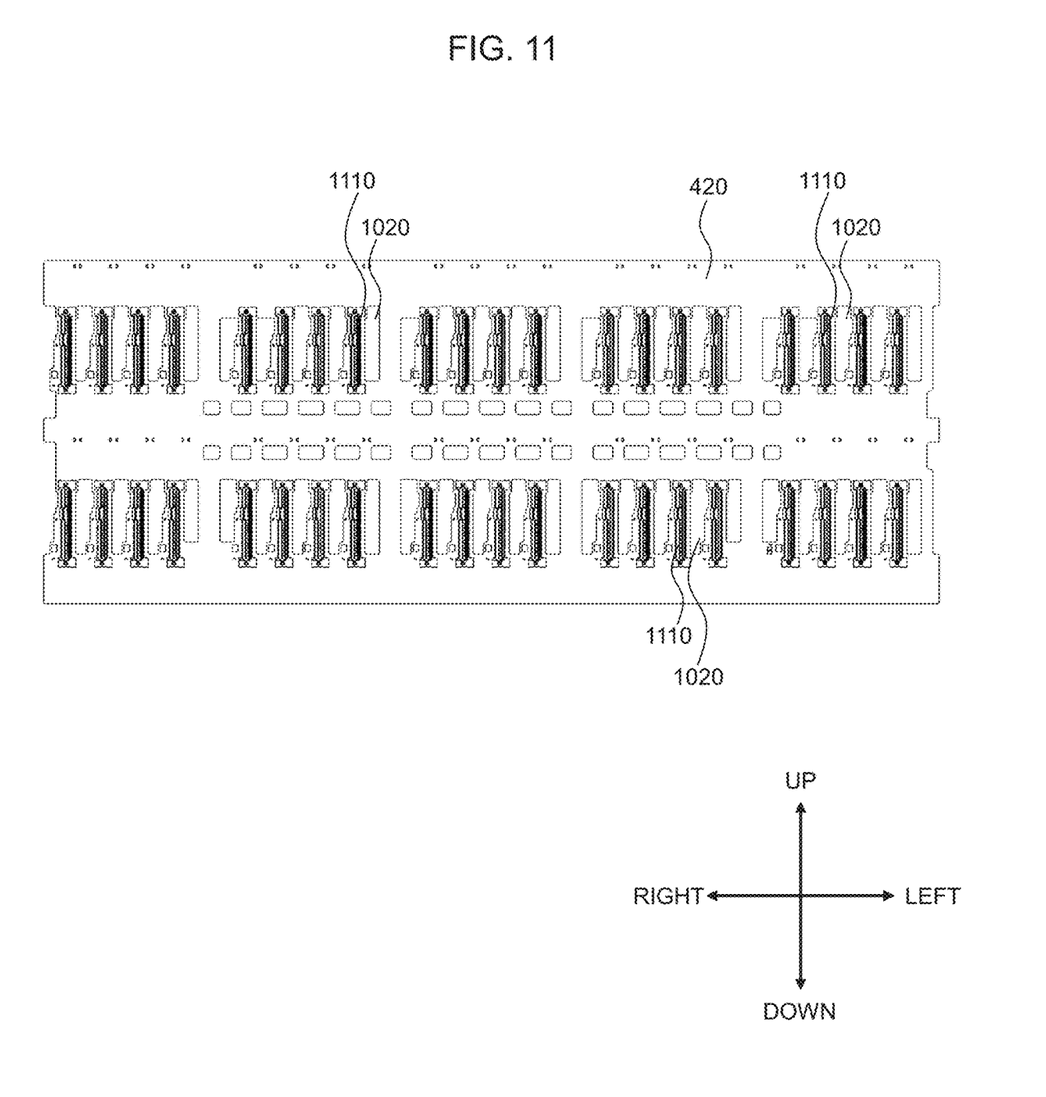
FIG. 11 is a diagram showing a front view of the midplane.

FIG. 11 is a diagram showing a front view of the midplane 420.

Rows of SSD connectors 1110 (a plurality of SSD connectors 1110 arranged in the left-right direction) are provided in upper and lower two stages. The SSDs 303 are coupled to the SSD connectors 1110.

The slits 1020 long in the up-down direction are provided on the left and the right of the SSD connectors 1110. The slits 1020 are an example of vent holes. Air is sucked from the front by the plurality of fans 930, flows in gaps among the SSDs 303, passes through the slits 1020, and flows from the front to the rear on the insides of the controllers 430. Consequently, the SSDs 303, the processors 950, and the like are cooled.

This embodiment is as explained above. The above explanation can be summarized, for example, as follows.

The power supply apparatuses 410 are coupled sideways to the connectors for power supply 10 on the rear surface of the midplane 420. The spaces are formed between the power supply apparatuses 410 and the controller board 980. Therefore, the rows of the connectors for controller can be extended to both the left and right ends of the rear surface of the midplane 420 (in other words, a mountable area of the connectors for controller is increased). As a result, it is possible to provide a larger number of connectors for controller along the left-right direction on the midplane rear surface without increasing the information processing apparatus 300 in size. For example, the SSD connectors 1110 and the connectors for controller do not overlap on the front and the rear of the midplane 420 (in a front view of the midplane 420). Therefore, a special control method, a busbar, and the like are unnecessary.

The processors 950 and the DIMMs 940 are disposed on the controller board 980. However, the DIMMs 940 are lower compared with the processors 950. Therefore, spaces on the DIMMs 940 are so-called dead spaces. The power supply apparatuses 410 set sideways are disposed in the dead spaces.

When the power supply apparatuses 410 longest in the front-rear direction are provided sideways, a range in which relatively high controller components can be disposed is narrowed in the left-right direction. Accordingly, for example, a mountable area along the left-right direction of the first fans 930B is narrowed. Therefore, deterioration in cooling performance is concerned.

Therefore, in the embodiment explained above, relatively low controller components are disposed in the spaces between the power supply apparatuses 410 set sideways and the controller board 980 (that is, under the power supply apparatuses 410). For example, the second fans 930S are disposed. Consequently, it is expected that the cooling performance is maintained.

A convex cover 450 covers the controller board 980. The convex cover 450 has a first upper surface 71 and a second upper surface 72 present at the second height lower than the first height. The power supply apparatuses 410 coupled to the rear surface of the midplane 420 are present on the second upper surface 72. The spaces are formed between the power supply apparatuses 410 and the controller board 980. However, the power supply apparatuses 410 can be supported by the second upper surface 72 of the convex cover 450.

The first fans 930B are present under the first upper surface 71 as an example of the relatively high controller components. The second fans 930S are present under the second upper surface 72 as an example of the relatively low controller components. The convex cover 450 has a first side surface extending from one side edge of the first upper surface 71 to the other side edge of the second upper surface 72 and a second side surface extending downward from one side edge of the second upper surface 72. The convex cover 450 guides cooling air generated by the plurality of fans 930. Consequently, it is expected that the cooling performance is maintained. In particular, the second upper surface 72 may be a flange that functions as a support for the power supply apparatuses 410 present in positions above and apart from the controller board 980 and functions as a guide for the cooling air as well.

The power supply apparatuses 410 are configured by power supply units 411 and battery units 412 set in series with the power supply units 411 and closer to the midplane 420 than the power supply units 411. The battery unit 412L is closer to power feed destinations (loads such as the controllers 430 and the SSDs 303) in a logical distance (shorter in a current path) compared with the power supply unit 411L. Therefore, efficient power feed is expected.

The same apparatus sets 400 in upper and lower two stages are provided. Each apparatus set 400 has a predetermined size (for example, 2U). The upper-side apparatus set 400U is a vertically reversed apparatus set. A gap may be substantially absent or, even if a gap is present, the gap may be small between the apparatus sets 400. Consequently, the apparatus sets 400 (the controllers 430 and the like) can be mounted in upper and lower two stages (in the rack 302 having predetermined height) such that the entire information processing apparatus 300 is fit in a predetermined size.

What is claimed is:

1. An information processing apparatus comprising:
a midplane, which is a circuit board;
a plurality of storage media drives coupled to a front surface of the midplane;
a controller coupled to a rear surface of the midplane; and
a rectangular parallelepiped power supply apparatus longest in a front-rear direction, wherein
the controller includes:
a controller board, which is a circuit board; and
a plurality of controller components provided on the controller board,
the plurality of controller components include a plurality of interface connectors arranged in a left-right direction along a front end of the controller substrate,
the front surface of the midplane includes a plurality of connectors for drive, the connectors for drive being connectors to which the storage media drives are respectively coupled,
the rear surface of the midplane includes:

a plurality of connectors for controller, which are a plurality of connectors arranged in the left-right direction to which the interface connectors of the controller are respectively coupled; and a connector for power supply, which is a connector to which the power supply apparatus set sideways is coupled, and a part of a row of the connectors for controller is present below the power supply apparatus coupled sideways to the connector for power supply.

2. The information processing apparatus according to claim 1, further comprising a cover that covers the controller board, wherein the plurality of controller components include two or more controller components having different heights, the cover includes:
a first upper surface present at first height; and
a second upper surface present at second height lower than the first height, and the power supply apparatus coupled to the rear surface of the midplane is present on the second upper surface.

3. The information processing apparatus according to claim 2, wherein the power supply apparatus is configured by a power supply unit and a battery unit set in series with the power supply unit and closer to the midplane than the power supply unit.

4. The information processing apparatus according to claim 3, wherein a first apparatus set and a second apparatus set, which are same apparatus sets, are coupled to the rear surface of the midplane, the first apparatus set and the second apparatus set are arrayed in an up-down direction, the first apparatus set is an apparatus set including the controller, the power supply apparatus, and the cover, and the second apparatus set is a vertically reversed apparatus set and is an apparatus set located on the first apparatus set.

5. The information processing apparatus according to claim 2, wherein the plurality of controller components include a plurality of fans that are arrayed in the left-right direction and respectively suck air in a front and exhaust the air to a rear, the plurality of fans include a first fan and a second fan lower than the first fan, the first fan is present under the first upper surface, the second fan is present under the second upper surface, and the cover includes a first side surface extending from one side edge of the first upper surface to another side edge of the second upper surface and a second side surface extending downward from one side edge of the second upper surface and guides cooling air generated by the plurality of fans.

6. The information processing apparatus according to claim 1, wherein the plurality of controller components include a plurality of fans that are arrayed in the left-right direction and respectively suck air in a front and exhaust the air to a rear, the plurality of fans include a first fan and a second fan lower than the first fan, and in a horizontal view of the controller board, the first fan is present in a position different from the power supply apparatus and the second fan is present in a position overlapping the power supply apparatus.

\* \* \* \* \*